US010613600B2

(12) United States Patent
Daly et al.

(10) Patent No.: US 10,613,600 B2
(45) Date of Patent: Apr. 7, 2020

(54) ADVANCED POWER BASED THERMAL CONTROL SYSTEMS

(71) Applicant: Microsoft Technology Licensing, LLC, Redmond, WA (US)

(72) Inventors: Gregory M. Daly, Seattle, WA (US); Garrett Douglas Blankenburg, Sammamish, WA (US); Andres Felipe Hernandez, Seattle, WA (US); Andrew C. Banks, Renton, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/802,369

(22) Filed: Nov. 2, 2017

(65) Prior Publication Data
US 2019/0129481 A1    May 2, 2019

(51) Int. Cl.
*G06F 1/20* (2006.01)
*G05D 23/19* (2006.01)
*H05K 7/20* (2006.01)

(52) U.S. Cl.
CPC ......... *G06F 1/206* (2013.01); *G05D 23/1919* (2013.01); *H05K 7/20836* (2013.01)

(58) Field of Classification Search
CPC . G06F 1/206; G05D 23/1919; H05K 7/20209
USPC ........................................................ 700/299
See application file for complete search history.

(56) References Cited

U.S. PATENT DOCUMENTS

| 5,737,171 | A | 4/1998 | Buller et al. |
| 6,757,592 | B1 | 6/2004 | Henderson et al. |
| 8,868,947 | B2 | 10/2014 | Park et al. |
| 8,935,547 | B2 | 1/2015 | Theocharous et al. |

(Continued)

FOREIGN PATENT DOCUMENTS

CN    106292963 A    1/2017

OTHER PUBLICATIONS

Lin, Y., Barooah, P., Meyn, S. and Middelkoop, T., 2015. Experimental evaluation of frequency regulation from commercial building HVAC systems. IEEE Transactions on Smart Grid, 6(2), pp. 776-783. (Year: 2015).*

(Continued)

*Primary Examiner* — Jason Lin
*Assistant Examiner* — Alicia M. Choi
(74) *Attorney, Agent, or Firm* — Alleman Hall Creasman & Tuttle LLP

(57) ABSTRACT

Examples are disclosed that relate cooling an electronic device based on power load. One disclosed example includes a controller configured to obtain a first measure of a power load, apply a filter to obtain a first filtered power load value, set a first thermal setpoint based at least on the first filtered power load value, determine a first temperature of the device, and adjust a response of the cooling mechanism based at least on the first thermal setpoint. The controller is further configured to obtain a second measure of the power load at a different time, apply the filter to obtain a second filtered power load value, set a second thermal setpoint based at least on the second filtered power load value, determine a second temperature of the device, and adjust the response of the cooling mechanism based at least on the second thermal setpoint.

20 Claims, 4 Drawing Sheets

(56) References Cited

U.S. PATENT DOCUMENTS

| | | | | |
|---|---|---|---|---|
| 8,996,183 | B2* | 3/2015 | Forbes, Jr. | G06Q 10/00 |
| | | | | 700/291 |
| 9,213,343 | B2* | 12/2015 | Campbell | H05K 7/2079 |
| 9,658,661 | B2* | 5/2017 | Shaw | H05K 7/20836 |
| 9,785,208 | B2* | 10/2017 | Lovicott | G06F 1/206 |
| 10,082,848 | B2* | 9/2018 | Iyer | G06F 1/206 |
| 2003/0011984 | A1* | 1/2003 | Chu | G06F 1/206 |
| | | | | 361/679.48 |
| 2003/0023889 | A1 | 1/2003 | Hofstee et al. | |
| 2003/0028569 | A1* | 2/2003 | Brokish | G06F 17/18 |
| | | | | 708/322 |
| 2004/0257013 | A1 | 12/2004 | Chhleda et al. | |
| 2013/0166095 | A1 | 6/2013 | Hadderman et al. | |
| 2015/0378404 | A1* | 12/2015 | Ogawa | G06F 1/206 |
| | | | | 700/300 |
| 2016/0146480 | A1* | 5/2016 | Ito | F24F 3/153 |
| | | | | 62/93 |
| 2016/0329612 | A1* | 11/2016 | Jung | H01M 10/44 |
| 2017/0060206 | A1* | 3/2017 | Lee | G06F 1/26 |
| 2018/0059747 | A1* | 3/2018 | Pfeifer | G06F 1/206 |
| 2018/0128510 | A1* | 5/2018 | LePoudre | F24F 13/30 |

OTHER PUBLICATIONS

"Cooling and Fan Controls", Retrieved From <<https://www.intel.in/content/www/in/en/support/articles/000005946/boards-and-kits.html>>, Retrieved on: Oct. 26, 2017, 5 Pages.

Atkinson, et al., ""Power Based Thermal Management of Device" Application as Filed in U.S. Appl. No. 15/425,896", Filed Date: Feb. 6, 2017, 33 Pages.

Burke, Mary, "Programming the Automatic Fan Speed Control Loop", Retrieved From <<http://www.t-es-t.hu/download/analog/an613.pdf>>, Retrieved on: Oct. 26, 2017, pp. 1-26.

Wang, et al., "Optimal Fan Speed Control for Thermal Management of Servers", In Proceedings of the ASME/Pacific Rim Technical Conference and Exhibition on Packaging and Integration of Electronic and Photonic Systems, MEMS, and NEMS, Jul. 19, 2009, pp. 1-11.

"International Search Report and Written Opinion Issued in PCT Application No. PCT/US2018/057898", dated Jan. 23, 2019, 10 Pages.

* cited by examiner

ADVANCED POWER BASED THERMAL CONTROL SYSTEMS

BACKGROUND

Electronic devices may produce excess heat during operation based on a power load drawn by the electronic device. If not mitigated, excess heat generated by an electronic device to be unreliable and/or cause device failure. Accordingly, electronic devices may include a cooling system to thermally regulate the device during operation.

SUMMARY

Examples are disclosed that relate cooling an electronic device based on power load. One disclosed example provides an electronic device comprising a processing system, a cooling mechanism for cooling the processing system, and a controller configured to obtain a first measure of a power load of the device at a first time, apply a filter to the first measure of the power load to obtain a first filtered power load value, and set a first thermal setpoint based at least on the first filtered power load value. The controller is further configured to determine a first temperature of the device, adjust a response of the cooling mechanism based at least on the first thermal setpoint and the first temperature of the device, obtain a second measure of the power load of the device at a second time, apply the filter to the second measure of the power load to obtain a second filtered power load value, set a second thermal setpoint based at least on the second filtered power load value, determine a second temperature of the device, and adjust the response of the cooling mechanism based at least on the second thermal setpoint and the second temperature of the device.

Another disclosed example provides a method for controlling a cooling mechanism for a device. The method comprising determining a measure of a power load of the device, determining an adjustment to make to a cooling mechanism control variable by computationally combining at least a setpoint-dependent term that is based on a comparison of a thermal setpoint to a current temperature and a setpoint-independent term that is based on the measure of the power load of the device, and adjusting the response of the cooling mechanism based on the adjustment determined.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
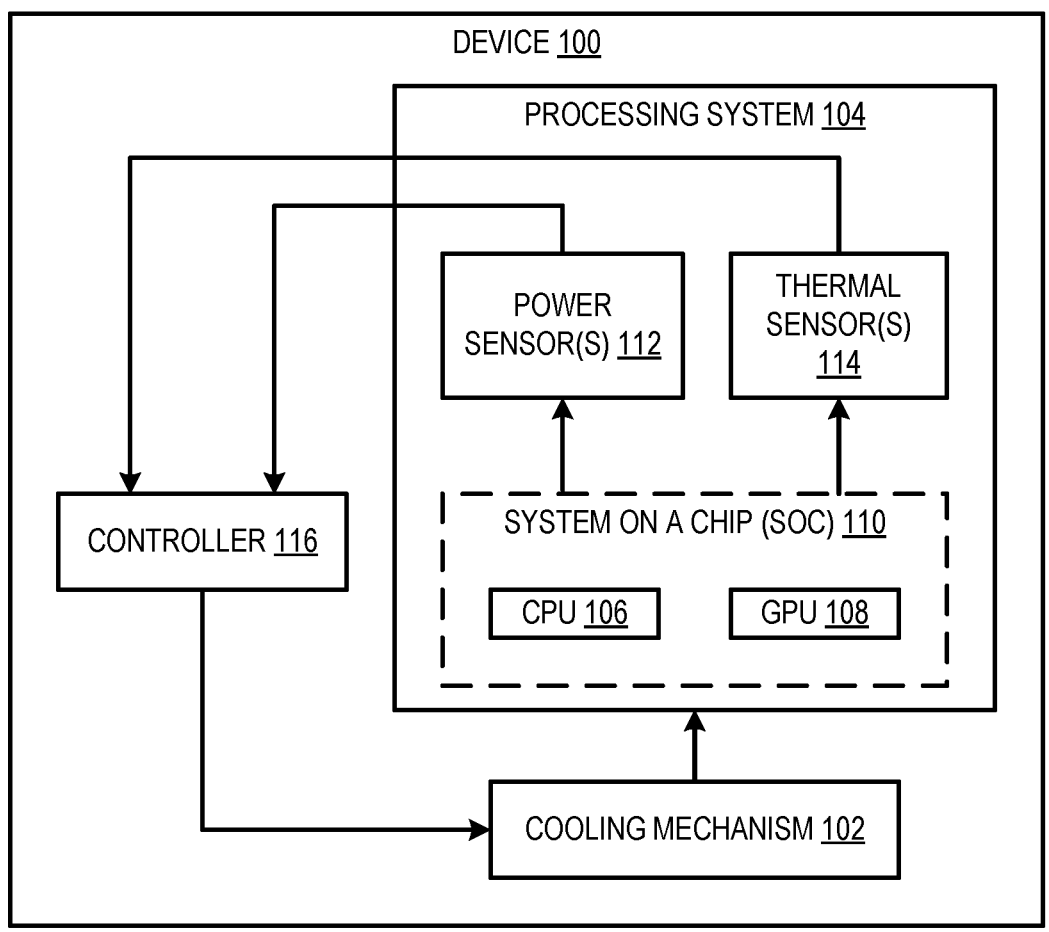
FIG. 1 shows a block diagram of an example electronic device comprising a cooling mechanism.

Various cooling strategies may be used to remove excess heat from an electronic device. Some cooling strategies may utilize a temperature setpoint to which temperature sensor data is compared for controlling a cooling mechanism, such as a fan. However, the use of a single setpoint may impact device operation in various instances. For example, when the thermal setpoint is set to a relatively lower temperature, during some operating conditions (e.g., when performing processor-intensive operations), the cooling system may have to respond more frequently, or reduce processing capability, based at least in part on the relatively lower setpoint. Further, where the cooling system uses a fan, the relatively lower setpoint may result in more noise from fan operation.

When the thermal setpoint is set to a relatively higher temperature, the device is allowed to become hotter, and may thus result in less frequent fan operation than a relatively lower thermal setpoint. However, by operating the device continuously at the higher thermal setpoint, an operational lifespan of the device may be shortened relative to operation of the device using a lower setpoint, as reliability of the heat-producing components of the device may be impacted by operating the device using the higher setpoint. Furthermore, in single setpoint systems, a response of the cooling system may overshoot the thermal setpoint during fast thermal transient conditions (e.g., when an idle processor is placed under a high processing load). In view of these factors, a lower thermal setpoint is often used in a single-setpoint system to help avoid the occurrence of such overshooting.

The use of a variable setpoint may mitigate problems encountered with the use of a single fixed setpoint. For example, a cooling system may vary a thermal setpoint based upon power load changes, where a lower setpoint is used during lower power load and a higher setpoint is used during higher power load. However, adjusting the setpoint based on power load may cause relatively sudden changes in cooling system performance, such as sudden increases in fan speed, which may be noticeable to a user.

Accordingly, examples are disclosed that relate to cooling systems and methods of operating cooling systems that may help to overcome such issues. For example, instead of using raw power load measurements as an input to a cooling mechanism adjustment algorithm, a filter may be applied to the power load measurements to smooth the response of the fan speed or other control variable in response to changes in power load. Such a filter may take the form, for example, of a feed forward mechanism that acts as a time constant. The resulting smoothing may help to make changes in the cooling system response less noticeable to a user compared to use of an unfiltered power load value for such control while still providing effective cooling.

Also, where a proportional integral derivative (PID) control algorithm is used to control the cooling mechanism, an additional setpoint-independent term based on power load may be added to a sum of the setpoint-dependent PID terms. The setpoint-independent term may help to smooth the PID response to changes in power load. Further, in some examples, the setpoint-independent term may include variable weighting to allow the cooling system to respond faster at higher temperatures where there may be less thermal overhead between the setpoint and the maximum operating temperature, and respond more slowly at lower temperatures to make the adjustment less noticeable to a user. The filtered power and setpoint-independent examples may be used independently or together.

FIG. 1 shows a simplified block diagram of an example electronic device 100 that may be thermally regulated by a cooling mechanism 102. The device 100 may take the form of any suitable electronic device that may be thermally regulated, including, but not limited to, a video game console, a personal computing device, a laptop computing device, and a tablet computing device.

In the example of FIG. 1, the device 100 includes a processing system 104 comprising a central processing unit (CPU) 106 and a graphics processing unit (GPU) 108. In some examples, the CPU and GPU may be separate devices, or integrated together in a system on a chip (SOC) 110. When performing computing operations, the CPU 106 and/or GPU 108 generate a power load. One or more power sensors 112 may be configured to measure the power load and report the measured power load to a controller 116.

The controller 116 may be configured to receive power load information from the power sensors 112 and temperature information from one or more thermal sensors 114. The power sensors 112 may be integrated into a voltage regulator of the CPU 106 and/or the GPU 108. As such, the controller 116 may be configured to estimate an overall power load based at least in part on power load information from the voltage regulator. As one example, in the case of the SOC 110 depicted in FIG. 1, the power load may be estimated by measuring all power rails of the SOC 110 across SOC process corners and power loads to determine a linear fit function based on the power load information of the CPU 106 and the GPU 108 that estimates the total power load of SOC 110.

The power sensors 112 may also comprise a current-sense resistor to determine the power load of the device 100. As another example, power load may be measured based upon an activity level of the processing system, such as a number of activities/threads/processes being performed by the processing system 104. The power sensors 112 may be configured to measure any suitable power characteristic (e.g., voltage, current, power) of any suitable portion of the device 100 (e.g., CPU 106, GPU 108, cooling mechanism 102). Power load may also be estimated using scalar values of any suitable power characteristic, which may be determined during system characterization, of any suitable portion of the device 100.

The thermal sensors 114 are configured to measure the temperature of heat-producing components of the device 100 (e.g., CPU 106, GPU 108, and/or SOC 110). The controller 116 may use temperature data obtained from the thermal sensors 114 to regulate the cooling mechanism 102 to help prevent components of device 100 from overheating. In one example, the one or more thermal sensors 114 may include diodes placed at different locations of the depicted components to measure different electrical junction temperatures. The thermal sensors 114 may be integrated within the SOC 110, and/or may be located outside of the SOC 110. The thermal sensors 114 may be configured to measure temperature characteristics of any suitable portion of the device 100 (e.g., CPU 106, GPU 108, cooling mechanism 102, interior of the device's housing, exhaust ports of the device).

The temperature of the device and the thermal setpoint are used at least in part by the controller 116 to control the cooling mechanism and thereby provide a response that cools the heat-producing components of device 100. The cooling mechanism 102 may be configured to thermally regulate the device 100 in any suitable manner. For example, the cooling mechanism 102 may be an active cooling mechanism that circulates a coolant (e.g., air or liquid) throughout the device 100 to transfer heat away from the processing system 104. An active cooling mechanism may comprise a fan configured to circulate air through the device 100. In this case, the controller 116 may be configured to output a pulse-width-modulated (PWM) duty cycle based at least in part on the power load and the temperature. Further, the controller 116 may control operation of the fan according to the PWM duty cycle. For example, the PWM duty cycle may be adjusted to adjust a speed of the fan.

In some implementations, the cooling mechanism 102 may include multiple cooling fans that are distributed throughout the device 100. In some such implementations, the controller 116 may be configured to control each cooling fan of the multiple cooling fans separately (e.g., based at least in part on separate thermal setpoints) to provide a desired response of the cooling mechanism 102 to thermally regulate the different portions of the device 100.

Further, in some implementations, the cooling mechanism 102 includes a liquid cooling circuit configured to circulate liquid coolant (e.g., water) through the processing system 104 and/or other components of the device 100 via operation of a pumping device. In some such implementations, the controller 116 adjusts the response of the cooling mechanism 102 by adjusting a pump response as a function of temperature based at least in part on the currently set thermal setpoint.

The cooling mechanism 102 may additionally or alternatively comprise a passive cooling mechanism. Adjusting the response of the cooling mechanism 102 may comprise throttling operation of the processing system. The passive cooling mechanism may instruct the processing system 104 to throttle operation, shut down power consuming tasks/processes/units, do less work, and/or take other actions to reduce a power load. Such commands may allow the processing system 104 to generate less heat during operation in order cool the device temperature based at least in part on the thermal setpoint. In yet other implementations, the cooling mechanism 102 may include a combination of active and passive cooling components to thermally regulate the processing system 104.

Figure 2A:
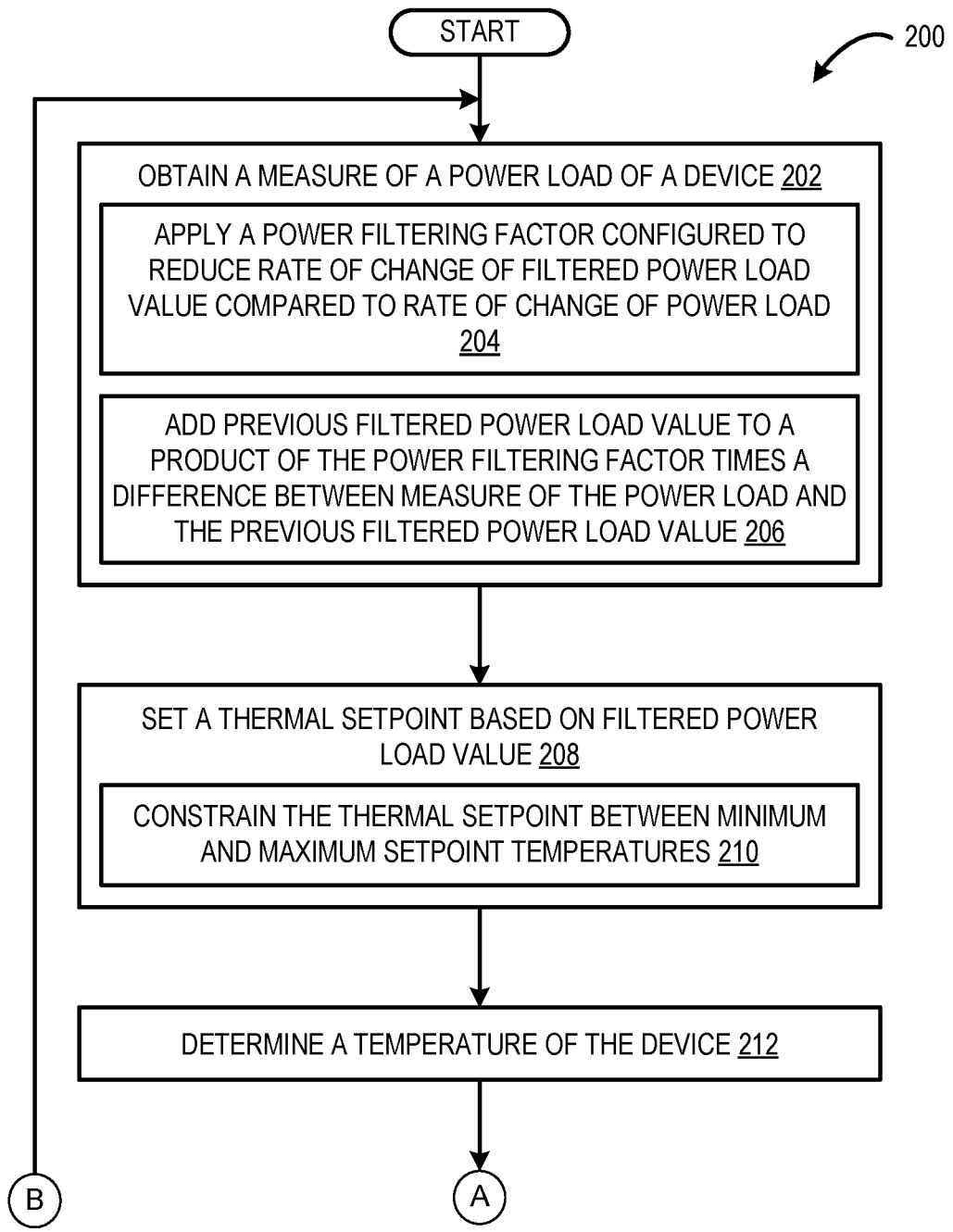
FIGS. 2A and 2B show a flow diagram depicting an example method of controlling a cooling mechanism for a device.
Figure 2B:
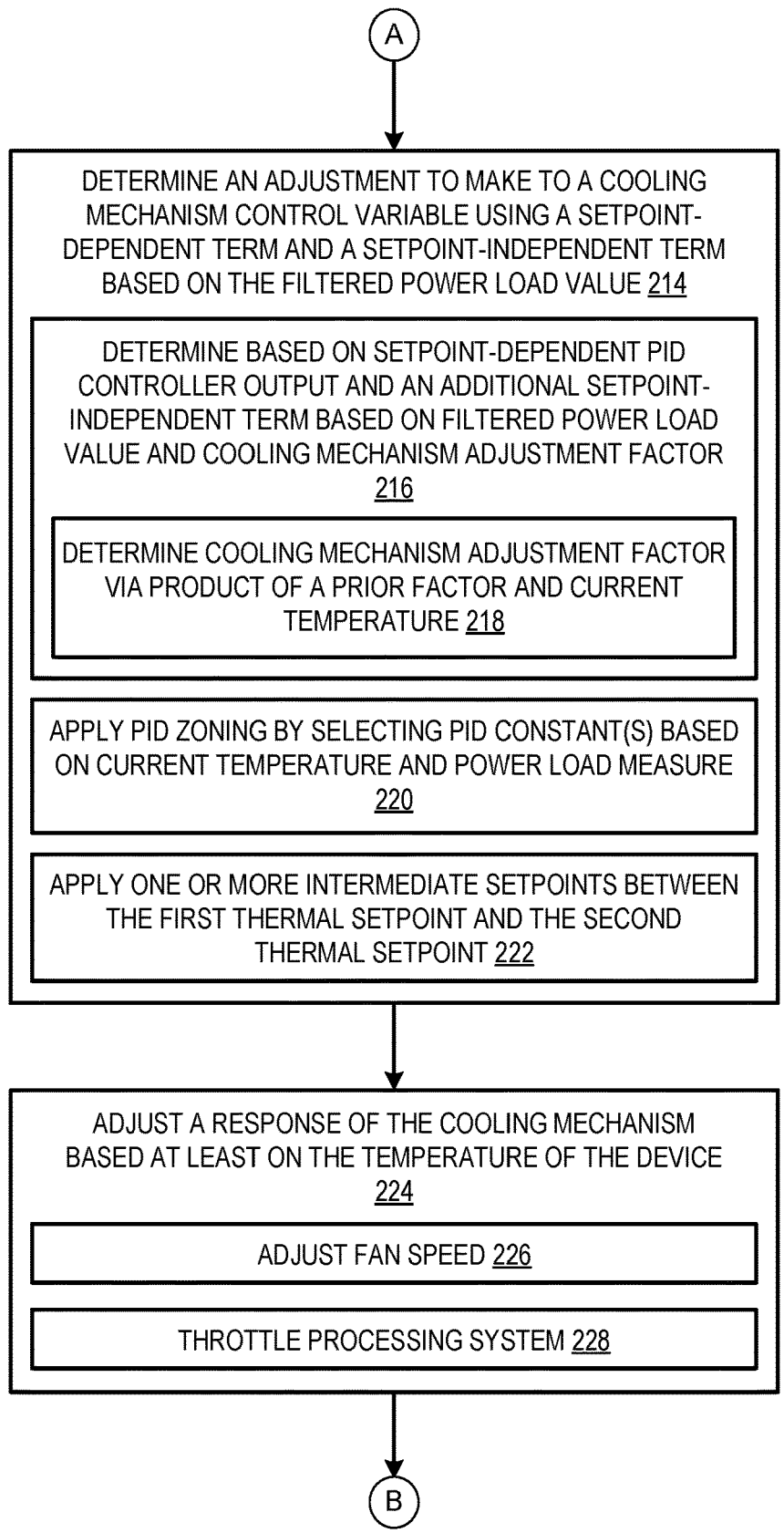

FIGS. 2A and 2B illustrate a flow diagram depicting an example method 200 of controlling a cooling mechanism for an electronic device. The following description of method 200 is provided with reference to the software and hardware components described above and shown in FIG. 1, but it will be appreciated that method 200 also may be performed in other contexts using other suitable hardware and software components.

First referring to FIG. 2A, at 202, method 200 includes obtaining a measure of a power load of a device. In some examples, the measure of the power load of the device may be estimated by one or more power sensors 112 integrated into a voltage regulator of the CPU 106 and/or the GPU 108. As such, the controller 116 may be configured to estimate the power load based at least in part on power load information from the voltage regulator. In the case of the SOC 110 depicted in FIG. 1, the power load may be estimated by measuring all power rails of the SOC 110 across SOC process corners and power loads to determine a linear fit function based on the power load information of the CPU 106 and the GPU 108 that estimates the total power load of SOC 110.

The power sensors 112 may be configured to measure any suitable power characteristic (e.g., voltage, current, power) of the device 100. In one example, the controller 116 may be configured to determine the power load as a moving average of a plurality of power load samples acquired during a designated duration (e.g., a window of 5 samples).

In some examples, the controller 116 may be configured to apply a power filtering factor to the measure of the power load, as shown at 204. The power filtering factor may be applied to reduce a rate of change of a filtered power load value compared to a rate of change of the power load, as indicated at 204, which may help to reduce overshoot and ringing of the cooling system in response to changes in power load.

Any suitable method may be used to obtain a filtered power load value. As one example, applying the power filtering factor may comprise utilizing the relationship shown in equation (1) below.

$$F = F + klpf*(P-F) \quad (1)$$

In this equation, F is the filtered power load value, $k_{lpf}$ is a power filtering factor, and P is power at the current time. In some examples, F may be set to current power P at device reset, and then adjusted as part of a loop during operation. Thus, this equation adds each previous filtered power load value to a product of the power filtering factor times a difference between measure of the power load and the previous filtered power load value, as indicated at 206. In other examples, any other suitable power filtering mechanism may be used to smooth changes in power over time.

Continuing, at 208, method 200 includes setting a thermal setpoint based on the filtered power load value. The thermal setpoint dictates a temperature at which the processing system 104 operates. The thermal setpoint may be set in any suitable manner. As one example, the setpoint may be set according to the relationship shown below in equation (2).

$$T = T_1 \le \frac{T_2 - T_1}{F_2 - F_1} * (F - F_1) + T_1 \le T_2 \quad (2)$$

In this relationship, $T_1$ represents a minimum setpoint, $T_2$ represents a maximum setpoint, F represents filtered power (such as that determined above using equation (1)), $F_1$ represents the filtered power value associated with the minimum setpoint, and $F_2$ represents the filtered power value associated with the maximum setpoint. In other examples, unfiltered power P may be used instead of F, which may lead to more rapid changes in setpoint. Equation (2) results in a linear setpoint adjustment constrained between minimum and maximum setpoint temperatures, as indicated at 210, wherein the linear relationship is based upon the $$T = T_1 \le \frac{T_2 - T_1}{F_2 - F_1} * (F - F_1) + T_1 \le T_2 \quad (2)$$

term. Due to the minimum and maximum constraints, power equal to or less than $F_1$ would be regulated to setpoint $T_1$, and power greater than or equal to $F_2$ would be regulated to $T_2$. In other examples, other adjustments than linear may be used, such as logarithmic and exponential adjustments.

The minimum setpoint temperature and maximum setpoint temperature may be selected based on any suitable factors. As one example, the minimum and maximum setpoint temperatures may be selected based upon factors such as product lifetime, acoustic presence of a cooling mechanism, and/or performance of the processing system.

Continuing with FIG. 2A, at 212, method 200 includes determining a temperature of the device (e.g. device component, device interior wall, and/or any other suitable measurement of device temperature). Next, referring to FIG. 2B, at 214 method 200 includes determining an adjustment to make to a cooling mechanism control variable.

In some examples, the adjustment may be made based on the filtered power load value. As a more specific example, the cooling mechanism may be controlled using a proportional-integral-derivative (PID) controller. The PID controller may be configured to calculate a difference between a thermal setpoint and a current temperature of the device and apply a correction to the difference based on a proportional term, an integral term and a derivative term, which are setpoint-dependent terms that are based at least on a comparison of the thermal setpoint and the temperature of the device. In such a controller, an additional setpoint-independent term based on the filtered power load value may be used. As an example, setpoint-dependent and setpoint-independent terms may be combined according to the relationship shown below in equation (3).

$$J_{next} = J_P + J_I + J_D + J_{fp} \quad (3)$$

In this relationship, $J_P + J_I + J_D$ represents the setpoint-dependent output of the PID controller, and $J_{fp}$ represents a setpoint-independent term added to the output of the PID controller to produce a combined output to adjust the response of the cooling mechanism.

The $J_{fp}$ term may have any suitable dependency on the filtered power. For example, this term may be determined based on a product of the filtered power load value and a cooling mechanism adjustment factor, as shown below in equation (4).

$$J_{fp} = F * k_{fp} \quad (4)$$

where $k_{fp}$ represents the cooling mechanism adjustment factor.

In some examples, $k_{fp}$ has a constant value across all power values and/or setpoints. In other instances, $k_{fp}$ may vary as a function of power, temperature, setpoint, and/or other variable(s). The use of a variable $k_{fp}$ may allow the control algorithm to have different responses at different temperatures. For example, a value of the cooling mechanism adjustment factor may be determined as product of a prior cooling mechanism adjustment factor and the current temperature of the device 100. as indicated at 218. One example is shown below in equation (5).

$$k_{fp} = k_{fp\_min} \le k_{fp0} * T_{hot} \le k_{fp\_max} \quad (5)$$

In this relationship, the cooling mechanism adjustment factor $k_{fp}$ is set between a minimum value, $k_{fp\_min}$, and a maximum value, $k_{fp\_max}$, and between these values has a value that is the product of a prior cooling mechanism adjustment factor, $k_{fp0}$, and the current temperature of the device, $T_{hot}$.

In the relationship of equation (5), the cooling mechanism 102 may respond more quickly at higher temperatures, and more slowly at lower temperatures. This may allow for more gradual transitions between fan speeds at lower temperatures for reduced acoustic presence, while enabling faster transitions at higher temperatures to more quickly address high thermal loads.

Faster response at higher temperatures and more gradual transitions at lower temperatures also may be accomplished by segmenting an operating power range into zones based on power draw. As one example, three example operating zones for a gaming console may be defined as follows:

(a) zone 1—idle, TV watching, casual games—low power draw, low thermal setpoint, (b) zone 2—high-definition media consumption by streaming or disc playback—(medium power draw, medium thermal setpoint, and (c) zone 3—high-end gameplay—high power draw, high setpoint.

A goal in zone 1 may be to regulate the device 100 to a lower temperature to increase product life. Since an active cooling mechanism 102, such as a fan, may be operating quietly in this zone, the response of the cooling mechanism 102 may be set to change faster as changes would be less perceptible for a user. In zone 2, as the fan speed may be higher, changes in the fan speed may be made more slowly. Whether an optical disc drive (ODD) is spinning or not, and at what speed, also may be incorporated into the algorithm in some examples, as at certain speeds, an acoustic presence of the ODD may be higher than that of the fan. In zone 3, the higher thermal setpoint may leave relatively less margin for thermal overshoot on the SOC 110.

In view of the different operating constraints in each zone, different control variables may be utilized for each zone. For example, ODD may be considered in some zones but not others. Further, different types of statistics may be utilized for each zone. For instance, in one zone the system may consider average temperatures, but in another, it may choose to use maximum temperatures.

As yet another example of a mechanism for controlling a rate of change of the thermal setpoint, one or more intermediate setpoints may be used to transition between the first thermal setpoint and the second thermal setpoint, as indicated at 222. For example, a step size between the intermediate setpoints may be regulated to make the transition from the first thermal setpoint to the second thermal setpoint more gradual. Similarly, the time allotted to transition between setpoints could be controlled.

For example, the controller 116 may choose to advance directly from one setpoint to the next, or may choose to remain at a setpoint for an amount of time before advancing. Error terms may also be incorporated into the step size or timing considerations. A controller 116 may also be configured such that it uses intermediate setpoints between certain temperature ranges but not others, uses intermediate setpoints to but not decrease, uses intermediate setpoints to decrease but not increase, etc.

Next, after having determined an adjustment to make to a cooling mechanism control variable, method 200 includes, at 224, adjusting a response of the cooling mechanism based at least on the temperature of the device. The cooling mechanism 102 may be configured to thermally regulate the device 100 in any suitable manner. For example, an active cooling mechanism may comprise a fan configured to circulate air through the device 100, and a speed of the fan may be adjusted, as indicated at 226. Likewise, a passive cooling mechanism may comprise adjusting a speed of a processing system, and cooling may be implemented by throttling operation of the processing system, as indicated at 228.

Method 200 may operate in a loop, as illustrated, to continuously regulate the temperature of the device 100. As such, a second measure of the power load of the device 100 may be obtained at a second time, a filter may be applied to the second measure of the power load to obtain a second filtered power load value, and a second thermal setpoint may be set based at least in part on the second filtered power load value. The controller 116 may be configured to determine a second temperature of the device 100 and adjust a response of the cooling mechanism 102 based at least on the second thermal setpoint and the second temperature of the device.

In some embodiments, the methods and processes described herein may be tied to a computing system of one or more computing devices. In particular, such methods and processes may be implemented as a computer-application program or service, an application-programming interface (API), a library, and/or other computer-program product.

Figure 3:
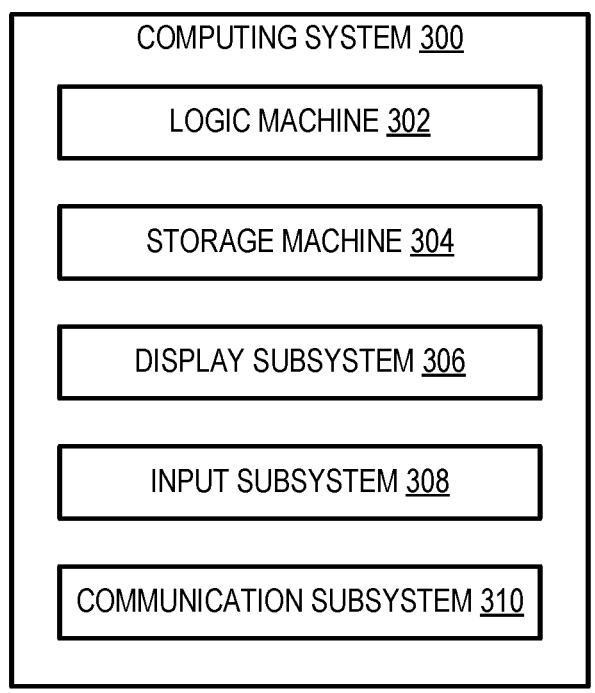
FIG. 3 shows a block diagram of an example computing system.

FIG. 3 schematically shows a non-limiting embodiment of a computing system 300 that can enact one or more of the methods and processes described above. Computing system 300 is shown in simplified form. Computing system 300 may take the form of one or more personal computers, server computers, tablet computers, home-entertainment computers, network computing devices, gaming devices, mobile computing devices, mobile communication devices (e.g., smart phone), and/or other computing devices.

Computing system 300 includes a logic machine 302 and a storage machine 304. Computing system 300 may optionally include a display subsystem 306, input subsystem 308, communication subsystem 310, and/or other components not shown in FIG. 3.

Logic machine 302 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage machine 304 includes one or more physical devices configured to hold instructions executable by the logic machine to implement the methods and processes described herein. When such methods and processes are implemented, the state of storage machine 304 may be transformed—e.g., to hold different data.

Storage machine 304 may include removable and/or built-in devices. Storage machine 304 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 304 may include volatile, nonvolatile, dynamic, static, read/write, read-only, random-access, sequential-access, location-addressable, file-addressable, and/or content-addressable devices.

It will be appreciated that storage machine 304 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 302 and storage machine 304 may be integrated together into one or more hardware-logic components. Such hardware-logic components may include field-programmable gate arrays (FPGAs), program- and application-specific integrated circuits (PASIC/ASICs), program- and application-specific standard products (PSSP/

ASSPs), system-on-a-chip (SOC), and complex programmable logic devices (CPLDs), for example.

When included, display subsystem 306 may be used to present a visual representation of data held by storage machine 304. This visual representation may take the form of a graphical user interface (GUI). As the herein described methods and processes change the data held by the storage machine, and thus transform the state of the storage machine, the state of display subsystem 306 may likewise be transformed to visually represent changes in the underlying data. Display subsystem 306 may include one or more display devices utilizing virtually any type of technology. Such display devices may be combined with logic machine 302 and/or storage machine 304 in a shared enclosure, or such display devices may be peripheral display devices.

When included, input subsystem 308 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 310 may be configured to communicatively couple computing system 300 with one or more other computing devices. Communication subsystem 310 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 300 to send and/or receive messages to and/or from other devices via a network such as the Internet.

Another example provides an electronic device, comprising a processing system, a cooling mechanism for cooling the processing system and a controller configured to obtain a first measure of a power load of the device at a first time, apply a filter to the first measure of the power load to obtain a first filtered power load value, set a first thermal setpoint based at least on the first filtered power load value, determine a first temperature of the device, adjust a response of the cooling mechanism based at least on the first thermal setpoint and the first temperature of the device, obtain a second measure of the power load of the device at a second time, apply the filter to the second measure of the power load to obtain a second filtered power load value, set a second thermal setpoint based at least on the second filtered power load value, determine a second temperature of the device, and adjust the response of the cooling mechanism based at least on the second thermal setpoint and the second temperature of the device. Setting the thermal setpoint based on the filtered power load value may additionally or alternatively include constraining the thermal setpoint between a minimum setpoint temperature and a maximum setpoint temperature. The filter may additionally or alternatively include a power filtering factor configured to reduce a rate of change of the filtered power load value compared to a rate of change of the power load. The second filtered power load value may additionally or alternatively be determined by adding the first filtered power load value to a product of the power filtering factor times a difference between the second measure of the power load and the first filtered power load value. The controller may additionally or alternatively include a proportional-integral-derivative (PID) controller configured to calculate a difference between a thermal setpoint and a current temperature of the device and apply a correction to the difference based on a proportional term, an integral term and a derivative term, and a term based at least in part on the filtered power load value to an output of the PID controller. The term based at least in part on the filtered power load value may additionally or alternatively include a product of the filtered power load value and a cooling mechanism adjustment factor. The cooling mechanism adjustment factor may additionally or alternatively include a product of a prior cooling mechanism adjustment factor and the current temperature of the device. The controller may additionally or alternatively be configured to select one or more of a controller gain, an integral time constant and a derivative time constant of the PID controller as a function of the current temperature of the device and the power load of the device. Adjusting the response of the cooling mechanism may additionally or alternatively include throttling operation of the processing system. The cooling mechanism may additionally or alternatively include a fan, and adjusting the response of the cooling mechanism may additionally or alternatively include adjusting the speed of the fan. The controller may additionally or alternatively be configured to limit a rate of change of a temperature of the device by applying one or more intermediate setpoints between the first thermal setpoint and the second thermal setpoint.

Another example provides a method for controlling a cooling mechanism for a device, the method comprising determining a measure of a power load of the device, determining an adjustment to make to a cooling mechanism control variable by computationally combining at least a setpoint-dependent term that is based on a comparison of a thermal setpoint to a current temperature, and a setpoint-independent term that is based on the measure of the power load of the device, and adjusting the response of the cooling mechanism based on the adjustment determined. The setpoint-dependent term may additionally or alternatively include an output of a proportional-integral-derivative (PID) controller. The setpoint-independent term may additionally or alternatively include a product of a filtered power load value and a cooling mechanism adjustment factor. The filtered power load value may additionally or alternatively include the product of the power load and a power filtering factor that is configured to reduce a rate of change of the filtered power load value compared to a rate of change of the power load. The cooling mechanism adjustment factor may additionally or alternatively include a product of a prior cooling mechanism adjustment factor and the current temperature.

Another example provides an electronic device comprising a processing system, a cooling mechanism for cooling the processing system, and a controller configured to obtain a measure of a power load of the device, apply a filter to the measure of the power load to obtain a filtered power load value, determine a temperature of the device, determine an adjustment to make to a cooling mechanism control variable by computationally combining at least a setpoint-dependent term that is based on a comparison of a thermal setpoint to a current temperature, and a setpoint-independent term that is based on the filtered power load value, and adjust a response of the cooling mechanism based at least on the temperature of the device. The setpoint-dependent term may additionally or alternatively include the output of a proportional-integral-derivative (PID) controller. The setpoint-independent term may additionally or alternatively include a product of the filtered power load value and a cooling mechanism adjustment factor. The cooling mechanism adjustment factor may additionally or alternatively include a product of a prior cooling mechanism adjustment factor and the current temperature.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An electronic device, comprising:
   a processing system;
   a cooling mechanism for cooling the processing system; and
   a controller configured to
      obtain a first measure of a power load of the device at a first time;
      apply a filter to the first measure of the power load to obtain a first filtered power load value;
      set a first thermal setpoint based at least on the first filtered power load value;
      determine a first temperature of the device;
      adjust a response of the cooling mechanism based at least on the first thermal setpoint and the first temperature of the device;
      obtain a second measure of the power load of the device at a second time;
      apply the filter to the second measure of the power load to obtain a second filtered power load value;
      set a second thermal setpoint based at least on the second filtered power load value;
      determine a second temperature of the device; and
      adjust the response of the cooling mechanism based at least on the second thermal setpoint and the second temperature of the device.

2. The device of claim 1, wherein setting the thermal setpoint based on the filtered power load value comprises constraining the thermal setpoint between a minimum setpoint temperature and a maximum setpoint temperature.

3. The device of claim 1, wherein the filter comprises a power filtering factor configured to reduce a rate of change of the filtered power load value compared to a rate of change of the power load.

4. The device of claim 3, wherein the second filtered power load value is determined by adding the first filtered power load value to a product of the power filtering factor times a difference between the second measure of the power load and the first filtered power load value.

5. The device of claim 1, wherein the controller includes a proportional-integral-derivative (PID) controller configured to calculate a difference between a thermal setpoint and a current temperature of the device and apply a correction to the difference based on a proportional term, an integral term and a derivative term, and a term based at least in part on the filtered power load value to an output of the PID controller.

6. The device of claim 5, wherein the term based at least in part on the filtered power load value comprises a product of the filtered power load value and a cooling mechanism adjustment factor.

7. The device of claim 6, wherein the cooling mechanism adjustment factor comprises a product of a prior cooling mechanism adjustment factor and the current temperature of the device.

8. The device of claim 5, wherein the controller is further configured to select one or more of a controller gain, an integral time constant and a derivative time constant of the PID controller as a function of the current temperature of the device and the power load of the device.

9. The device of claim 1, wherein adjusting the response of the cooling mechanism comprises throttling operation of the processing system.

10. The device of claim 1, wherein the cooling mechanism comprises a fan, and wherein adjusting the response of the cooling mechanism comprises adjusting a speed of the fan.

11. The device of claim 1, wherein the controller is configured to limit a rate of change of a temperature of the device by applying one or more intermediate setpoints between the first thermal setpoint and the second thermal setpoint.

12. A method for controlling a cooling mechanism for a device, the method comprising:
   determining a measure of a power load of the device;
   applying a filter to the measure of the power load to obtain a filtered power load value;
   setting a thermal setpoint based at least on the filtered power load value;
   determining an adjustment to make to a cooling mechanism control variable by computationally combining at least
      a setpoint-dependent term that is based on a comparison of the thermal setpoint to a current temperature, and
      a setpoint-independent term that is based on the filtered power load value, the setpoint-independent term comprising a product of the filtered power load value and an adjustment factor; and
   adjusting a response of the cooling mechanism based on the adjustment determined.

13. The method of claim 12, wherein the setpoint-dependent term comprises an output of a proportional-integral-derivative (PID) controller, and wherein computationally combining the setpoint-dependent term and the setpoint-independent term comprises adding the setpoint-dependent term and the setpoint-independent term.

14. The method of claim 12, wherein setting the thermal setpoint comprises classifying the power load into one of a plurality of operating zones.

15. The method of claim 12, wherein the filtered power load value comprises a product of the power load and a power filtering factor that is configured to reduce a rate of change of the filtered power load value compared to a rate of change of the power load.

16. The method of claim 12, wherein the adjustment factor comprises a product of a prior adjustment factor and the current temperature.

17. An electronic device, comprising:
   a processing system;
   a cooling mechanism for cooling the processing system; and a controller configured to
- obtain a measure of a power load of the device;
- apply a filter to the measure of the power load to obtain a filtered power load value;
- set a thermal setpoint based at least on the filtered power load value;
- determine a temperature of the device;
- determine an adjustment to make to a cooling mechanism control variable by computationally combining at least
  - a setpoint-dependent term that is based on a comparison of the thermal setpoint to a current temperature, and
  - a setpoint-independent term that is based on the filtered power load value, the setpoint-independent term comprising a product of the measure of the power load of the device and an adjustment factor; and
- adjust a response of the cooling mechanism based at least on the adjustment determined.

18. The device of claim 17 wherein the setpoint-dependent term comprises an output of a proportional-integral-derivative (PID) controller.

19. The device of claim 17 wherein the setpoint-independent term comprises a product of the filtered power load value and the adjustment factor.

20. The device of claim 19, wherein the adjustment factor comprises a product of a prior adjustment factor and the current temperature.

* * * * *